US008890567B1

(12) United States Patent
Lewis

(10) Patent No.: US 8,890,567 B1
(45) Date of Patent: Nov. 18, 2014

(54) HIGH SPEED TESTING OF INTEGRATED CIRCUITS INCLUDING RESISTIVE ELEMENTS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 1007 days.

(21) Appl. No.: 12/894,636

(22) Filed: Sep. 30, 2010

(51) Int. Cl.
H01L 25/00 (2006.01)
H03K 19/00 (2006.01)
G06F 17/50 (2006.01)

(52) U.S. Cl.
USPC ................ 326/41; 326/38; 716/101; 716/117

(58) Field of Classification Search
USPC .......... 326/37–41, 47; 327/564; 716/100–139
See application file for complete search history.

(56) References Cited

U.S. PATENT DOCUMENTS

| 4,870,302 | A | 9/1989 | Freeman |
| 5,243,238 | A | 9/1993 | Kean |
| 5,260,611 | A | 11/1993 | Cliff et al. |
| 5,455,525 | A | 10/1995 | Ho et al. |
| 5,485,103 | A | 1/1996 | Pedersen et al. |
| 5,537,057 | A | 7/1996 | Leong et al. |
| 5,541,530 | A | 7/1996 | Cliff et al. |
| 5,581,199 | A | 12/1996 | Pierce et al. |
| 5,592,106 | A | 1/1997 | Leong et al. |
| 5,682,107 | A | 10/1997 | Tavana et al. |
| 5,689,195 | A | 11/1997 | Cliff et al. |
| 5,701,091 | A | 12/1997 | Kean |
| 5,705,939 | A | 1/1998 | McClintock et al. |
| 5,847,579 | A | 12/1998 | Trimberger |
| 5,880,598 | A | 3/1999 | Duong |
| 5,907,248 | A | 5/1999 | Bauer et al. |
| 5,909,126 | A | 6/1999 | Cliff et al. |
| 5,914,616 | A | 6/1999 | Young et al. |
| 5,942,913 | A | 8/1999 | Young et al. |
| 6,084,429 | A | 7/2000 | Trimberger |
| 6,107,824 | A | 8/2000 | Reddy et al. |
| 6,204,690 | B1 | 3/2001 | Young et al. |
| 6,278,291 | B1 | 8/2001 | McClintock et al. |
| 6,292,018 | B1 | 9/2001 | Kean |
| 6,300,794 | B1 | 10/2001 | Reddy et al. |
| 6,492,834 | B1 | 12/2002 | Lytle et al. |
| 6,630,842 | B1 | 10/2003 | Lewis et al. |
| 6,670,825 | B1 | 12/2003 | Lane et al. |
| 6,696,855 | B1 | 2/2004 | Kapusta et al. |
| 6,970,014 | B1 | 11/2005 | Lewis et al. |
| 7,280,392 | B2 * | 10/2007 | Liaw et al. ................. 365/163 |
| 7,702,978 | B2 * | 4/2010 | Lewis et al. ................ 714/725 |

(Continued)

OTHER PUBLICATIONS

Betz et al., Architecture and CAD for Deep-Submicron FPGAs, Mar. 1999, Chapters 2, 4, 5 and 7, pp. 11-19, 63-103, 105-126, and 151-190, Kluwer Academic Publishers.

(Continued)

Primary Examiner — Dylan White
(74) Attorney, Agent, or Firm — Mauriel Kapouytian Woods LLP; Ararat Kapouytian

(57) ABSTRACT

In one aspect, a method of testing an IC is provided. In one embodiment, the method includes: programming a resistive element in the IC at an intermediate ON state, where in addition to the intermediate ON state, the resistive element has another ON state, further where at the intermediate ON state, the resistive element has a resistance that is at least 10 times greater than a resistance of the resistive element at the another ON state; and applying test data to the resistive element.

19 Claims, 9 Drawing Sheets

(56) References Cited

U.S. PATENT DOCUMENTS

| 8,238,174 B2 * | 8/2012 | Yan et al. ............... 365/189.16 |
| 2008/0291723 A1 * | 11/2008 | Wang et al. ............. 365/185.3 |
| 2012/0069633 A1 * | 3/2012 | Katoh ....................... 365/148 |
| 2012/0075907 A1 | 3/2012 | Jo |
| 2012/0221919 A1 * | 8/2012 | Ekas et al. ................. 714/758 |
| 2013/0135008 A1 | 5/2013 | Zhang et al. |
| 2013/0148405 A1 * | 6/2013 | Kang et al. ................ 365/148 |

OTHER PUBLICATIONS

Tada et al., Highly Scalable Nonvolatile TiOx/TaSiOy Solid-electrolyte Crossbar Switch Integrated in Local Interconnect for Low Power Reconfigurable Logic, IEEE, 2009, pp. 943-946.

Sakamoto et al., A Ta2O5 solid-electrolyte switch with improved reliability, Symposium on VLSI Technology Digest of Technical Papers, 2007, pp. 38 and 39.

* cited by examiner

HIGH SPEED TESTING OF INTEGRATED CIRCUITS INCLUDING RESISTIVE ELEMENTS

BACKGROUND

The present invention relates to testing integrated circuits (ICs).

Programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names), are well-known ICs that provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

FIG. 1 illustrates an overview of an IC 100 along with a configuration device 105 coupled to IC 100. IC 100 may be programmed with data stored in configuration device 105, which could be external to IC 100, as shown in FIG. 1, or internal to IC 100. IC 100 may, for example, be a PLD. IC 100 includes configurable elements 110, configuration controller 115 (which may include error detection), address registers 120 and data registers 125.

Configurable elements 110 may, for example, be configuration memories. Configuration elements that are field programmable are often implemented as random access memory (RAM) cells, which in PLDs are sometimes referred to a "configuration RAM" (CRAM)). CRAMs are generally implemented as static RAM (SRAM). Thus, CRAMs generally refer to SRAM. The CRAM is typically arranged in an array of columns and rows of memory cells. Some of the CRAM may be used to control routing on the PLD, and others to control various logic functions. Each cell of a routing CRAM is typically connected to the gate terminal of a corresponding pass gate, which normally acts as a switch connecting a data input terminal to a data output terminal. Thus, configuration elements 110 may include CRAMs that control pass transistors to form configurable routing switches.

Configuration controller 115 receives the data from configuration device 105, which may be a memory as shown, or other configuration device. Configuration controller 115 accesses configuration device 105 and may use its address and control signals and receives data from its data signals, and loads the data into the CRAM. This loading is commonly done by sequentially shifting a '1' or '0' through each bit position in address registers 120. During programming, the '1' in an address register enables a particular column of CRAM for programming. Also, during programming, a '0' in an address register indicates that the column below that address register is not selected for programming. For each column, data bits are loaded into data registers 125 and programmed into the selected column. Configuration controller 115 may also include the ability to read back data from the CRAM by selecting a column and loading the data into data registers 125, and transferring it into configuration controller 115. During reading, the '1' in the address register indicates that data in the column corresponding to the address register are to be read. Also, during reading, the '0' in the address register indicates that data in the column corresponding to the address register are not to be read. Configuration controller 115 may include the ability to perform error checking on the data that is read back, or to transmit the data off of IC 100.

As noted above, configuration elements 115 are generally implemented as CRAM. In some cases, however, resistive elements may be used to replace either the CRAM or the CRAM and pass gate, if the resistive element has a suitably low ON state resistance. Thus, the resistive elements may be used both as memories and as electrical switches. These resistive elements may be electrolytic switches, such as, for example, conductive bridge devices. However, the resistive elements are not limited to this example and may be any suitable resistive element that has a high impedance mode (where the resistive element essentially acts as a switch in an OFF state) and a low impedance mode (where the resistive element essentially acts as a switch in an ON state). As an example, a high impedance mode has a resistance on the order of $10^9$ ohms ($\Omega$), whereas a low resistance mode has a resistance on the order of $10^3$ to $10^4 \Omega$. A high OFF state resistance helps prevent leakage when the device is not being used to conduct current, and a low ON state resistance helps provide high speed in transmitting signals through the device.

As noted above, a number of these resistive elements (i.e., switches) may be used to replace the configurable routing switches in an IC. However there is a difficulty in testing ICs using these devices. For the purposes of explanation, a moderate sized IC might have $100 \times 10^6$ switches arranged in a 10,000 row by 10,000 column array. Columns are programmed sequentially, one at a time. While CRAM cells conventionally used in ICs switch in a few nanoseconds (nS), the electrolytic switches can require on the order of 100 microseconds ($\mu$S) to program. Thus, the time to program all columns sequentially is on the order of one second. Since thousands of test patterns are required to test an IC, test times on the order of an hour are possible, which is too expensive for production testing.

Embodiments of the present invention arise in this context.

SUMMARY

In one aspect, an embodiment of the present invention provides a method of testing an IC, the method including: programming a resistive element in the IC at an intermediate ON state, where in addition to the intermediate ON state, the resistive element has another ON state, further where at the intermediate ON state, the resistive element has a resistance that is at least 10 times greater than a resistance of the resistive element at the another ON state; and applying test data to the resistive element.

In another aspect, an embodiment of the present invention provides an IC including: a plurality of resistive elements; and a configuration controller coupled to the plurality of resistive elements, where the configuration controller includes a programming mode controller, where, during testing of the IC, the programming mode controller provides programming signals to program at least one resistive element of the plurality of resistive elements in an intermediate ON state, and, during normal usage of the IC, the programming mode controller provides programming signals to program the at least one resistive element in another ON state, further where, at the intermediate ON state, the at least one resistive element has a resistance that is at least 10 times greater than its resistance at the another ON state.

In one embodiment, programming the resistive element at the intermediate ON state is faster than programming it at the above-mentioned another ON state (e.g., the normal ON state, which is defined below). In one embodiment, programming a resistive element at the intermediate ON state requires $\frac{1}{100}^{th}$ of the time required for programming the resistive element at the normal ON state.

In addition to saving time, programming the resistive element at the intermediate ON state also reduces wear on the resistive element. Resistive elements typically have a limited number of operational cycles. Use of the intermediate ON state (which may also be referred to as partial programming) will reduce the wear on the resistive device during testing and decrease the number of full programming cycles that are needed to provide a testable and reliable product.

BRIEF DESCRIPTION OF THE DRAWINGS

For purpose of explanation, several aspects of a particular embodiment of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
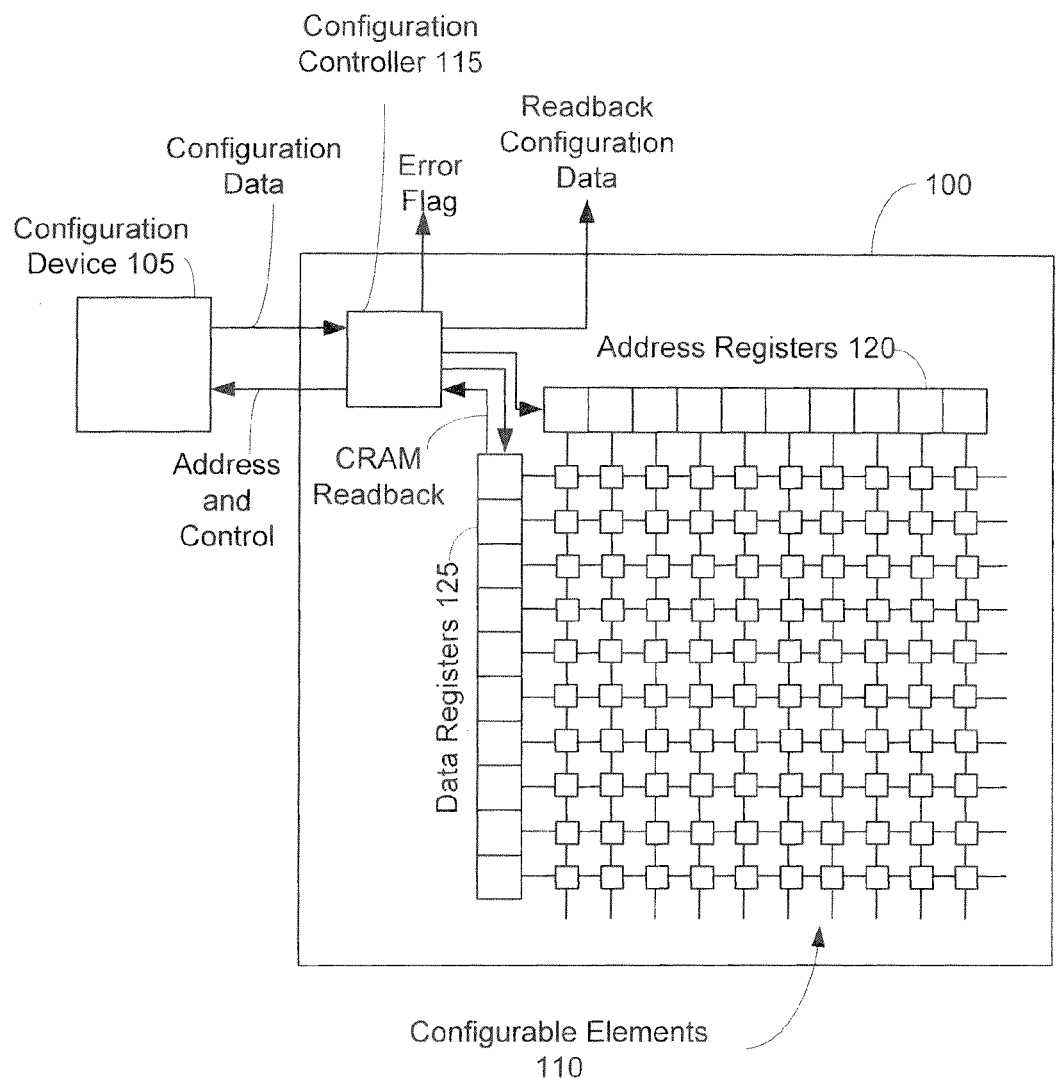
FIG. 1 is a block diagram of an IC and a configuration device.
Figure 2:
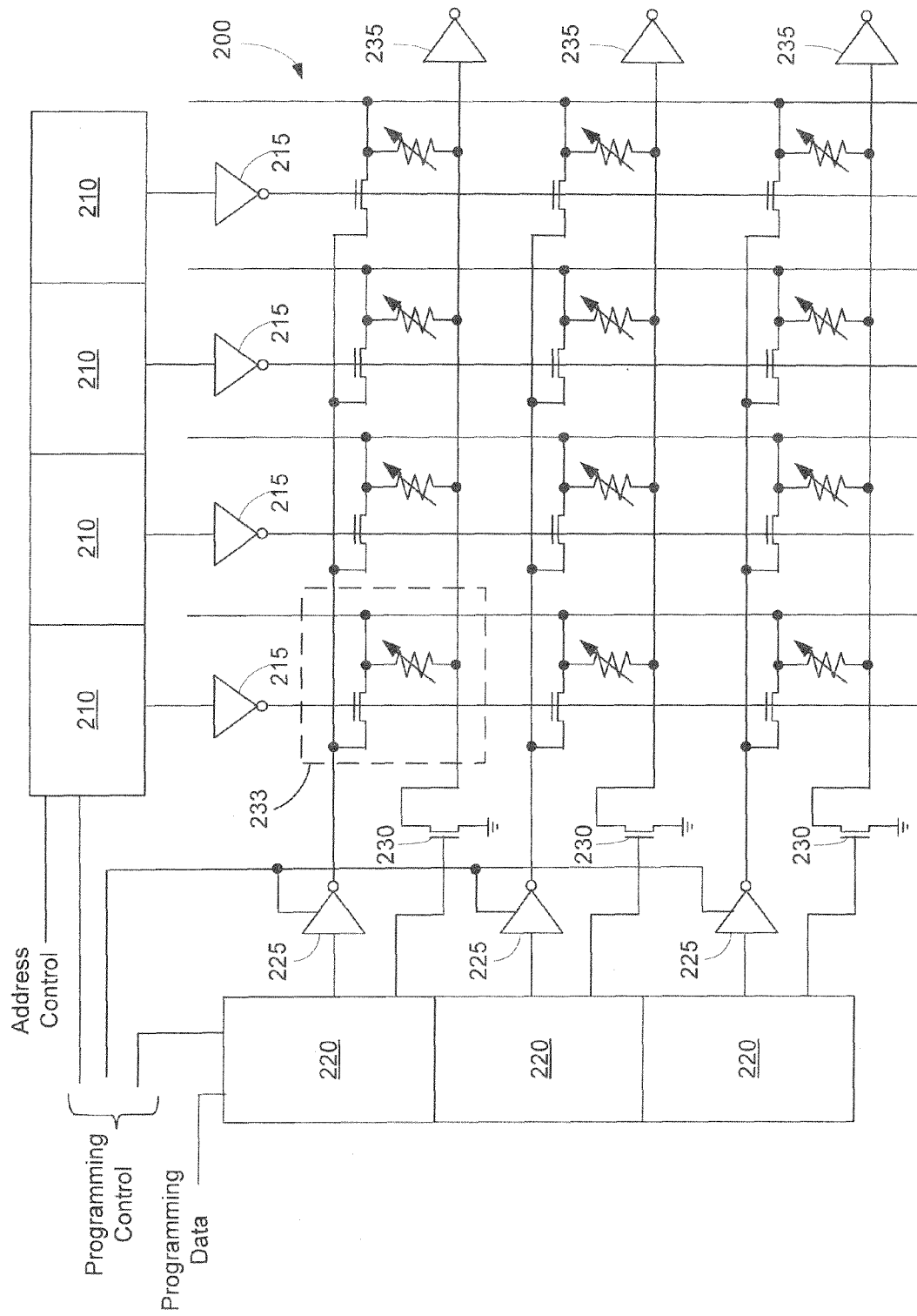
FIG. 2 is a detailed diagram of an example of a programmable resistive switching network of an IC in which embodiments of the methods of the present invention can be used.

FIG. 2 is a detailed diagram of an example of a programmable resistive switching network of an IC in which embodiments of the methods of the present invention can be used. In addition to programmable resistive switching network 200, FIG. 2 also shows address registers 210, their corresponding column input drivers 215, data registers 220, their corresponding row input drivers 225, grounding switches 230, and output drivers 235. It is to be noted that in another embodiment, the programmable resistive switching network may be said to include one or more of address registers 210, column input drivers 215, data registers 220, row input drivers 225, grounding switches 230, and output drivers 235.

As can be seen in FIG. 2, programmable resistive switching network 200 includes four columns and three rows, where each column includes three switching circuits (such as switching circuit 233) and each row includes four switching circuits (such as switching circuit 233). A 4 column by 3 row programmable resistive switching network is shown simply for ease of illustration and description. Those skilled in the art would recognize that an actual implementation of the programmable resistive switching network would include many more columns and rows. In other words, the programmable resistive switching network is more generally an M column by N row array, where M and N are both integers greater than one. For example, in a moderately sized IC, M and N may each be equal to 10,000.

Figure 3:
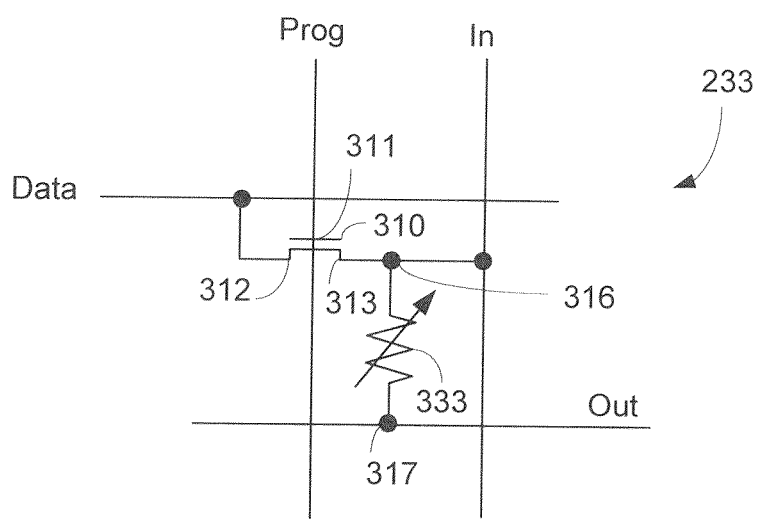
FIG. 3 is a detailed diagram of one embodiment of a switching circuit in the programmable resistive switching network of FIG. 2.

FIG. 3 is a detailed diagram of one embodiment of a switching circuit in the programmable restive switching network of FIG. 2. In FIG. 3, switching circuit 233 includes access transistor 310 and resistive element 333, which are coupled as shown. Resistive element 333 may also herein be referred to as resistive switch 333, programmable resistive switch 333, or programmable resistive element 333.

The gate terminal 311 of access transistor 310 is coupled to the programming terminal on which the programming signal is received. The programming signal is received from the driver corresponding to the column to which switching circuit 233 belongs in the programmable resistive switching network. One terminal 312 of access transistor 310 is coupled to the data terminal on which the data signal is received. The data signal is received from the row driver corresponding to the row to which switching circuit 233 belongs in the programmable resistive switching network. The other terminal 313 of access transistor 310 is coupled to the input terminal of switching circuit 233 which is also coupled to terminal 316 of resistive element 333. On the other hand, terminal 317 of resistive element 333 is coupled to the output terminal of switching circuit 233. Terminals 316 and 317 may also herein be referred to as the programming terminals of resistive element 333.

Access transistor 310 controls the programming path to resistive element 333. When the programming signal has a high binary value (i.e., is Vcc or a 1 bit), the access transistor 310 is turned ON. This allows the row driver corresponding to resistive element 333 to provide a data signal to resistive element 333. This programs resistive element 333 in the desired state. It is to be noted that, in one embodiment, during programming resistive element 333, the output terminal coupled to terminal 317 is grounded (i.e., has a low binary value).

In one embodiment, when resistive element 333 is programmed, it will have one of three states: an OFF state, an intermediate resistance ON state, and a low resistance ON state (which may also herein be referred to as a normal ON state). In the OFF state, input terminal 316 is effectively electrically isolated form output terminal 317. On the other hand, in the intermediate resistance ON state and the low resistance ON state, input terminal 316 and output terminal 317 are electrically coupled through resistive element 333.

Figure 4:
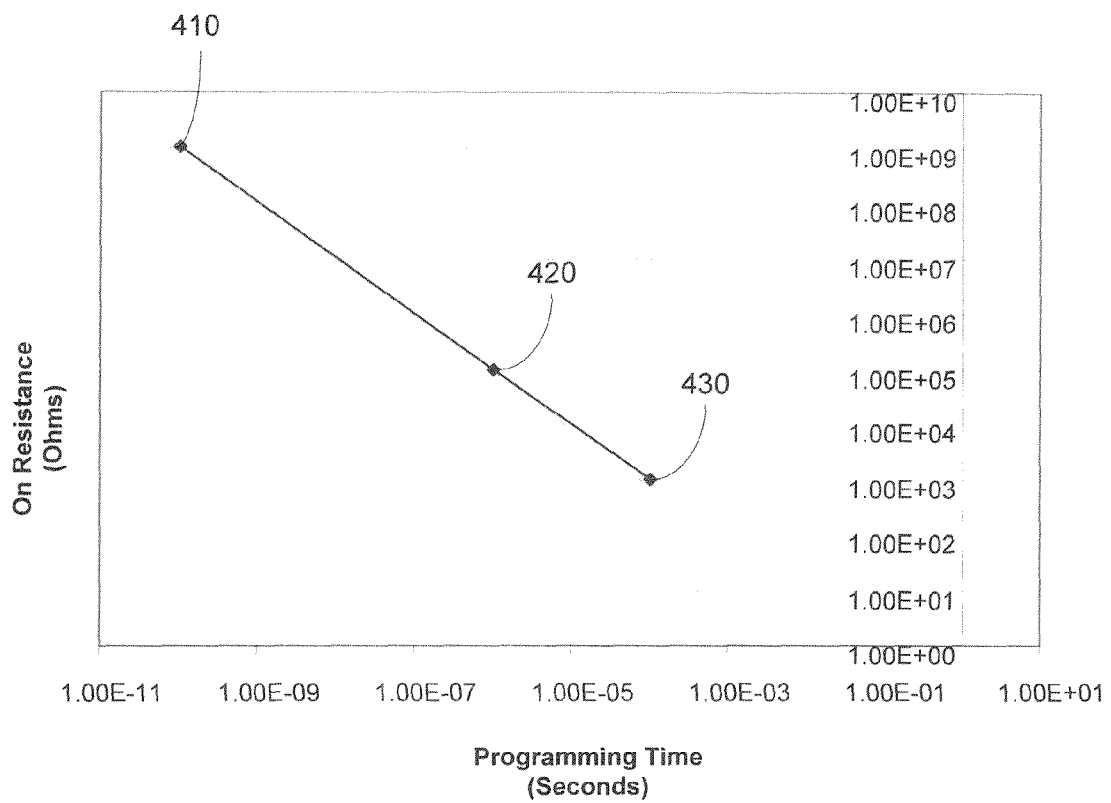
FIG. 4 is an example of the graph of the resistance versus programming time for resistive elements used in embodiments of the present invention.

FIG. 4 is an example of a graph of the resistance versus programming time for resistive elements (e.g., resistive element 333 (shown in FIG. 3) and resistive element 633 (shown in FIG. 6)) used in embodiments of the present invention. As can be seen in FIG. 4, the resistance of the resistive element is inversely proportional to the programming time. In other words, the resistance of the resistive element decreases with increased programming time. For example, at 410, with a programming time of approximately $10^{-10}$ seconds, the resistance is approximately $10^{+9}\Omega$, whereas, at 430, with a programming time of approximately $10^{-4}$ seconds, the resistance is approximately $10^{+3}\Omega$. At 410, the resistive element is programmed in an OFF state. On the other hand, at 430, the resistive element is programmed in an ON state. The ON state at 430 may also herein be referred to as the low resistance ON state, the normal resistance ON state, or the normal ON state. The resistive element, at 420, has a second ON state, where its resistance is approximately $10^{+5}\Omega$. This ON state may herein be referred to as an intermediate resistance ON state or intermediate ON state. As used, herein an intermediate ON state is an ON state whose resistance is greater than the resistance of another ON state and lower than the resistance of an OFF state. More specifically, in one embodiment, an intermediate ON state is an ON state where the resistance of the resistive element is at least 10 times greater (i.e., at least an order of magnitude greater) than the resistance of the resistive element in another ON state (e.g., the normal ON state). In one embodiment, the resistance of the resistive element in the intermediate ON state is 100 times greater (i.e., two orders of magnitude greater) than the resistance of the resistive element in another ON state (e.g., the normal ON state).

In one embodiment, programming the resistive element in the normal ON state involves applying a voltage difference across the programming terminals of the resistive element for a time period. This applied voltage difference and corresponding time period are herein respectively referred to as the normal voltage difference and the normal time period. The programming terminals of the resistive element are the terminals of the resistive element to which programming voltages are applied.

In another embodiment, programming the resistive element in the normal ON state involves applying a current to the programming terminals of the resistive element for a time period. This applied current and corresponding time period are herein respectively referred to as the normal programming current and the normal time period. The programming terminals of the resistive element are the terminals of the resistive element to which programming currents are applied.

Those skilled in the art would recognize that, in one embodiment, applying the normal voltage difference across the programming terminals of the resistive element for the normal time period results in applying a normal programming current to the resistive element.

In one embodiment, programming the resistive element in the intermediate ON state involves applying the normal voltage difference across the programming terminals of the resistive element for a time period shorter than the normal time period. This shorter time period is herein referred to as the intermediate time period. In one embodiment, the intermediate time period is 10 times shorter than the normal time period. In another embodiment, the intermediate time period is 100 times shorter than the normal time period. In another embodiment, programming the resistive element in the intermediate ON state involves applying a voltage difference smaller than the normal voltage difference across the programming terminals of the resistive element for the normal time period. This smaller voltage difference is herein referred to as the intermediate voltage difference. In one embodiment, the intermediate voltage difference is 10 times smaller than the normal voltage difference. In another embodiment, the intermediate voltage difference is 100 times smaller than the normal voltage difference. As discussed below, in an embodiment where the resistive element has a non-linear current-voltage behavior, the intermediate voltage difference may be only slightly smaller than the normal voltage difference.

In another embodiment, programming the resistive element in the intermediate ON state involves applying the normal programming current to the resistive element for a time period shorter than the normal time period. This shorter time period is herein referred to as the intermediate time period. In one embodiment, the intermediate time period is 10 times shorter than the normal time period. In another embodiment, the intermediate time period is 100 times shorter than the normal time period. In another embodiment, programming the resistive element in the intermediate ON state involves applying a programming current smaller than the normal programming current to the resistive element for the normal time period. This smaller programming current is herein referred to as the intermediate programming current. In one embodiment, the intermediate programming current is 10 times smaller than the normal programming current. In another embodiment, the intermediate programming current is 100 times smaller than the normal programming current.

In one embodiment, applying the normal voltage difference across the programming terminals of the resistive element for the intermediate time period results in applying the normal programming current for the intermediate time period to the resistive element. Also, in one embodiment, applying the intermediate voltage difference across the programming terminals of the resistive element for the normal time period results in applying the intermediate programming current for the normal time period to the resistive element. As noted above, in one embodiment, the intermediate programming current is 10 times smaller than the normal programming current. In another embodiment, the intermediate programming current is 100 times smaller than the normal programming current.

It is to be noted that, in another embodiment, the resistive elements may have a non-linear voltage-current behavior. Thus, for example, applying a voltage difference nearly identical to the normal voltage difference across the resistive element may result in applying a current much lower than the normal programming current to the resistive element. In such an embodiment, the intermediate voltage difference may be only slightly smaller than the normal voltage difference.

In one embodiment, a resistive element is programmed at an intermediate resistance ON state during testing of the IC device that includes the resistive element. Also, in one embodiment, a resistive element is programmed at the normal ON state, which is an ON state used during normal use of the IC, as opposed to during testing of the IC.

It is to be noted that a resistive element used in embodiments of the present invention does not have a binary switching state, i.e., a single ON state and a single OFF state. Instead, it has multiple ON states with different programming times. Also, the example shown in FIG. 4 shows a continuous relationship between the resistance and programming time of the resistive element. However, embodiments of the present invention may also be practiced with resistive elements that do not exhibit such a continuous relationship. In this respect, it is to be noted that it is conceivable that the resistive elements would have multiple ON states (e.g., two ON states) with corresponding programming times without the presence of the afore-mentioned continuous relationship.

It is also to be noted that as used herein normal voltage difference and intermediate voltage differences applied across the programming terminals of a resistive element refers to non-zero voltage differences. Similarly, the normal time period and intermediate time period refer to the time periods for which these non-zero voltage differences are applied. Similarly, as used herein the normal programming current and the intermediate programming current refer to non-zero currents.

Referring back to FIG. 2, the driver corresponding to a column of the programmable resistive switching network is coupled to the gates of the access transistors of all the switching circuits in that column. Similarly, the driver corresponding to a row of the programmable resistive switching network is coupled to a terminal of the access transistors of all the switching circuits in that row. Moreover, as can be seen in FIG. 2, the grounding switch of each row is coupled to the output terminal of each switching circuit in the corresponding row. Similarly, the output driver of each row is coupled to the output terminal of each switching circuit in the corresponding row.

In programmable resistive switching network 200, each of the column input drivers 215 is an inverter. In another embodiment, the column input drivers may be buffers or amplifiers. Similarly, in programmable resistive switching network 200, each of the row input drivers 225 is a tristate inverter. However, in another embodiment, they may be inverters, buffers, or amplifiers. Finally, each of the output drivers 235 is an inverter. In another embodiment, the output drivers may be buffers or amplifiers.

Figure 8:
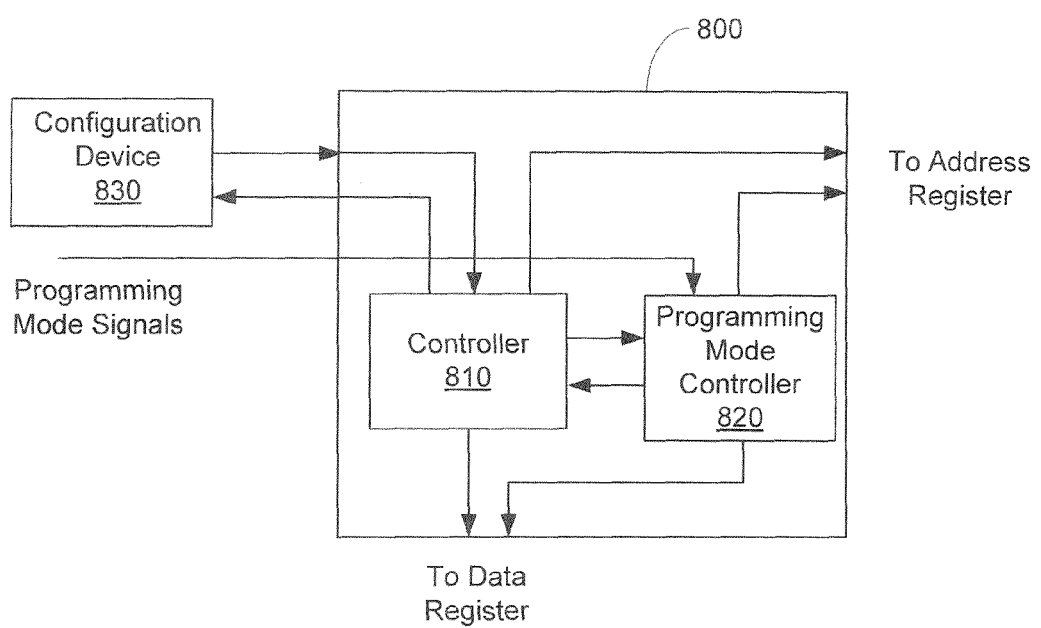
FIG. 8 is a block diagram of one embodiment of a configuration controller in an IC of the present invention.

Address registers 210 receive an address control signal and a programming control signal from an embodiment of the configuration controller of the present invention, which is shown in greater detail in FIG. 8. The address control signal determines whether the switching circuits of a particular column are to be programmed, while the programming control signal determines whether fast or normal programming is to be used for that column and, if applicable, the type of fast programming. In one embodiment, the programming control signals applied to columns in the programmable resistive switching network determine the duration for which the access transistors will be ON and the programming voltages/currents will be applied to the resistive elements.

Data registers 220 receive programming data and programming control signals from an embodiment of the configuration controller of the present invention, which is shown in greater detail in FIG. 8. The programming data determines the value of data (i.e., a 0 or 1 bit) to be applied to a switching circuit in the corresponding row, where a 0 bit corresponds to programming a resistive element in an OFF state and a 1 bit corresponds to programming a resistive element in an ON state. The programming control signals determine whether fast or normal programming is to be used for that row and, if applicable, the type of fast programming. In one embodiment, the programming control signals applied to rows in the programmable resistive switching network determine the duration and/or amplitude of the programming voltage/current applied to the row inputs of the resistive switches to be programmed. In the embodiment shown in FIG. 2, the programming control signal applied to the tristate input of the input row drivers 225 determines the amplitude of the programming voltage/current, whereas the programming control signal applied to input row drivers 225 through data registers 220 determines the duration of the programming voltage/current.

Figure 5:
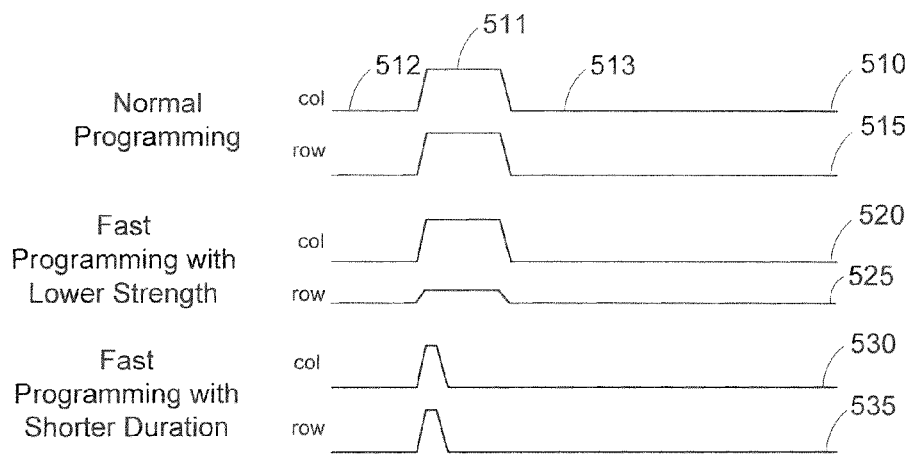
FIG. 5 is a graph of the programming signals for various modes of programming resistive elements in the programmable resistive switching network of FIG. 2.

FIG. 5 is a graph of the programming signals for various modes of programming the programmable resistive switching network of FIG. 2. In one embodiment, signals 510 and 515 respectively represent examples of the column voltage and row current output by the column input driver and the row input driver, respectively, in normal mode programming. In normal mode programming, the resistive element is programmed in a normal ON state. On the other hand, in one embodiment, signals 520 and 525 respectively represent examples of the column voltage and row current output by the column input driver and the row input driver, respectively, in fast mode programming with lower strength. Finally, in one embodiment, signals 530 and 535 respectively represent examples of the column voltage and row current output by the column input driver and the row input driver, respectively, in fast mode programming with shorter duration. In fast mode programming (with lower strength or with shorter duration or both), the resistive element is programmed in an intermediate ON state.

In another embodiment, signals 515, 525, and 535 may represent the row voltages output by the row input drivers in the normal mode programming, the fast mode programming with lower strength, and fast programming mode with shorter duration, respectively. It is to be noted that the amplitudes of signals 515, 525, and 535 are not necessarily the same when representing row currents and voltages. As such, in some embodiments, the amplitudes of the corresponding current and voltage signals are different.

It is to be noted that during all the programming modes, the voltage output by the column input driver (i.e., the voltage applied to the gate of the access transistor) has a high binary value in order to turn on the access transistor. This allows for the voltage output by the row input driver (minus the voltage drop across the access transistor) to be applied to one programming terminal of the resistive switch. Similarly, it allows for the current output by the row input driver to be applied to the resistive element, more specifically to the one programming terminal of the resistive element. The other programming terminal of the resistive switch is coupled to grounding switch 230, which is ON during programming.

During normal programming, the voltage applied across the resistive element is the normal programming voltage applied for the normal time period. This allows the resistive element to be programmed at the normal ON state. Also, in one embodiment, during normal programming, a normal programming current is applied to the resistive element for the normal time period.

During fast programming with lower strength, in one embodiment, the voltage applied across the resistive element is the intermediate programming voltage applied for the normal time period. In another embodiment, during fast programming with lower strength, the intermediate programming current is applied to the resistive element for the normal time period. This allows the resistive element to be programmed at an intermediate ON state.

Finally, during fast programming with shorter duration, in one embodiment, both the voltage output by the column input driver and the voltage output by the row input driver are of the intermediate time period. However, the voltage applied across the resistive element is the normal programming voltage. In another embodiment, during fast programming with shorter duration, the column input driver outputs a high binary value signal to turn the access transistor ON for the intermediate time period and the row input driver applies the normal programming current to the resistive element for the intermediate time period. This also allows the resistive element to be programmed at an intermediate ON state.

In one embodiment, resistive elements in programmable resistive switching network 200 are programmed one column at a time for testing the IC. In one such embodiment, resistive elements are programmed using fast programming with shorter duration. Accordingly, a signal is applied to the column driver of the column to be programmed such that it outputs a signal such as signal 530. The column drivers of the other columns receive signals such that they output a low binary value (i.e., a 0 bit or 0 volt signal). Similarly, signals are provided to the row drivers such that the row driver of each row whose corresponding resistive element is to be programmed in the intermediate ON state outputs a signal such as signal 535. Row drivers whose corresponding resistive elements are to be programmed in the OFF state are provided signals such that each of those row drivers outputs a low binary value.

In another embodiment, multiple columns of resistive elements in programmable resistive switching network 200 are programmed simultaneously for testing the IC. In one such embodiment, resistive elements are programmed using fast programming with lower strength. Accordingly, a signal is applied to the column drivers of the columns to be programmed such that they each output a signal such as signal 520. The column drivers of the other columns receive signals such that they output a low binary value. Similarly, signals are provided to the row drivers such that each row driver whose corresponding resistive element is to be programmed in the intermediate ON state outputs a signal such as signal 525. Row drivers whose corresponding resistive elements are to be programmed in the OFF state are provided signals such that each of those row drivers outputs a low binary value. In one specific embodiment, resistive elements in 100 columns are programmed simultaneously.

In such an embodiment, the time for programming each column in the programmable resistive switching network may remain the same. However, since a lower programming voltage/current is applied to each column, multiple columns may be programmed simultaneously without dissipating excessive power in the IC device. Programming multiple columns simultaneously, without violating the thermal limits of the IC device, allows for reducing the total time to program all the columns in the programmable resistive switching network. Those skilled in the art would recognize that programming multiple columns simultaneously involves including additional programming circuits to manage the greater complexity involved in the simultaneous programming.

In yet another embodiment, it is also possible to combine the fast programming with shorter duration and fast programming with lower strength. In other words, in such an embodiment there would be fast programming that involves both shorter duration (for the programming time period used for each column) and lower strength (for the programming voltage/current applied).

Figure 6:
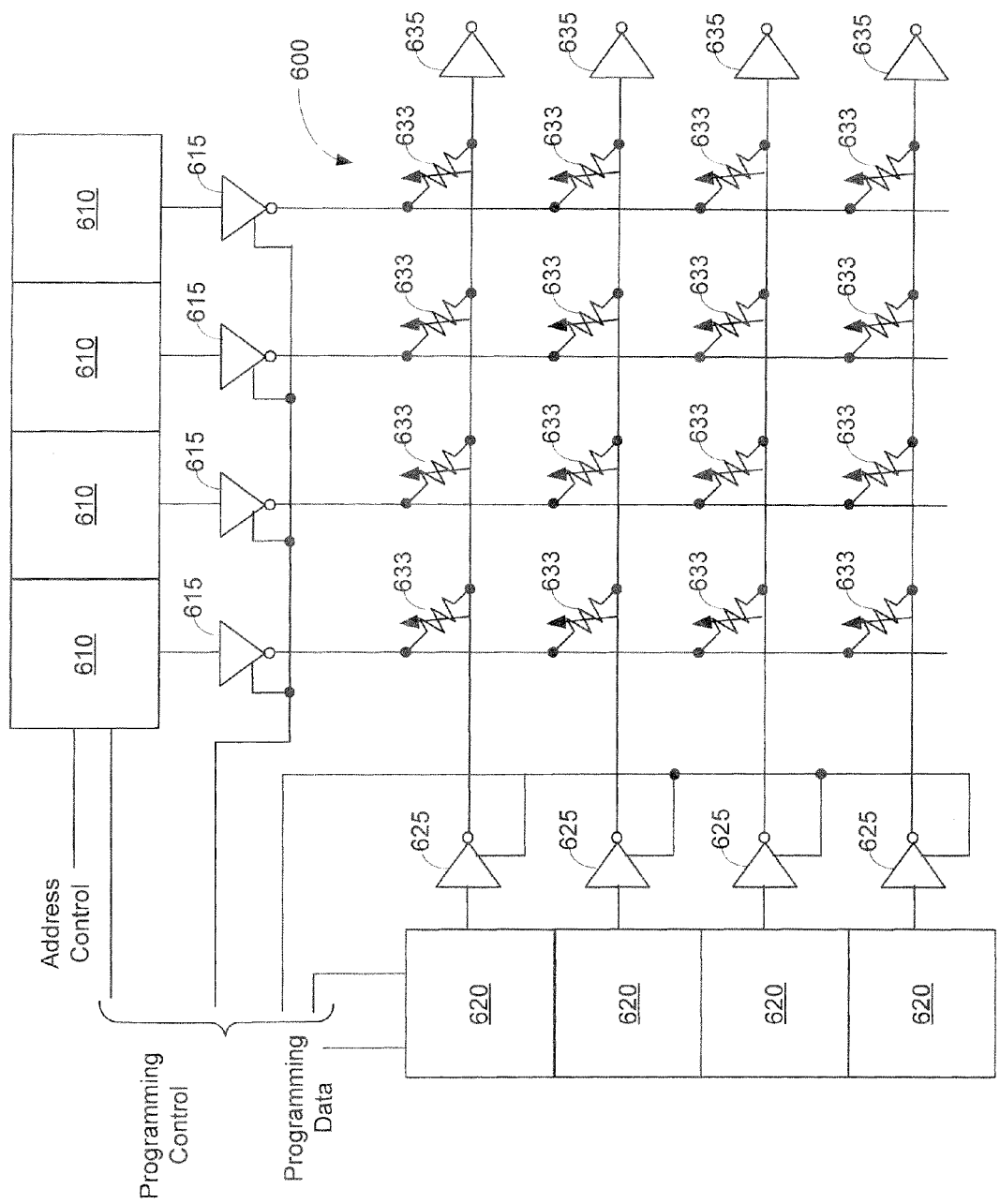
FIG. 6 is a detailed diagram of another example of a programmable resistive switching network of an IC in which embodiments of the methods of the present invention can be used.

FIG. 6 is a detailed diagram of another example of a programmable resistive switching network of an IC in which embodiments of the methods of the present invention can be used. In addition to programmable resistive switching network 600, FIG. 6 also shows address registers 610, their corresponding column input drivers 615, data registers 620, their corresponding row input drivers 625, resistive elements 633, and output drivers 635. It is to be noted that in another embodiment, the programmable resistive switching network may be said to include one or more of address registers 610, column input drivers 615, data registers 620, row input drivers 625, and output drivers 635.

As can be seen in FIG. 6, programmable resistive switching network 600 includes four columns and four rows. A 4 column by 4 row programmable resistive switching network is shown simply for ease of illustration and description. Those skilled in the art would recognize that an actual implementation of the programmable resistive switching network would include many more columns and rows. In other words, the programmable resistive switching network is more generally an M column by N row array, where M and N are as defined above. For example, in a moderately sized IC, M and N may each be equal to 10,000.

As shown in FIG. 6, each switching circuit in programmable resistive switching network 600 is a resistive element 633. Some of the characteristics of resistive element 633 (which is like resistive element 333) are described in greater detail above in reference to FIG. 4. Each resistive element 633 is coupled to the output terminals of its corresponding column input driver and row input driver and the input terminal of its corresponding output driver. More specifically, in each switching circuit, one terminal of resistive element 633 is coupled to the output terminal of the column input driver on its corresponding column, whereas another terminal of resistive element 633 is coupled to the output terminal of the row input driver on its corresponding row and the input terminal of the output driver for its corresponding row.

In programmable resistive switching network 600, the column driver corresponding to a column of the programmable resistive switching network is coupled to one terminal of the resistive element of all the switching circuits in that column. Similarly, the driver corresponding to a row of the programmable resistive switching network is coupled to the other terminal of the resistive element of all the switching circuits in that row. Similarly, the output driver of each row is coupled to the output terminal of each switching circuit in the corresponding row.

In programmable resistive switching network 600, each of the column input drivers 615 is a tristate inverter. In another embodiment, the column input drivers may be buffers or amplifiers. Similarly, in programmable resistive switching network 600, each of the row input drivers 625 is a tristate inverter. However, in another embodiment, they may be buffers or amplifiers. Finally, each of the output drivers 635 is an inverter. In another embodiment, the output drivers may be buffers or amplifiers.

Address registers 610 receive an address control signal and a programming control signal from an embodiment of the configuration controller of the present invention, which is shown in greater detail in FIG. 8. The address control signal determines whether the switching circuits of a particular column are to be programmed, while the programming control signal determines whether fast or normal programming is to be used for that column and, if applicable, the type of fast programming. In one embodiment, the programming control signal applied to columns in the programmable resistive switching network determine the duration and strength of the programming voltage/current applied to the column inputs of the resistive elements to be programmed. In the embodiment shown in FIG. 6, the programming control signal applied to the tristate input of the input column drivers 615 determines the amplitude of the programming voltage/current, whereas the programming control signal applied to the input column drivers 615 through address registers 610 determines the duration of the programming voltage/current.

Data registers 620 receive programming data and programming control signals from an embodiment of the configuration controller of the present invention, which is shown in greater detail in FIG. 8. The programming data signal determines the value of data (i.e., a 0 or 1 bit) to be applied to a switching circuit in the corresponding row, where a 0 bit corresponds to programming a resistive element in an OFF state and a 1 bit corresponds to programming a resistive element in an ON state. The programming control signals determine whether fast or normal programming is to be used for that row and, if applicable, the type of fast programming. In one embodiment, the programming control signals applied to rows in the programmable resistive switching network determine the duration and amplitude of the programming voltage/current applied to the row inputs of the resistive elements to be programmed. In the embodiment shown in FIG. 6, the programming control signal applied to the tristate input of the input row drivers 625 determines the amplitude of the programming voltage/current, whereas the programming control signal applied to input row drivers 625 through data registers 620 determines the duration of the programming voltage/current.

Figure 7:
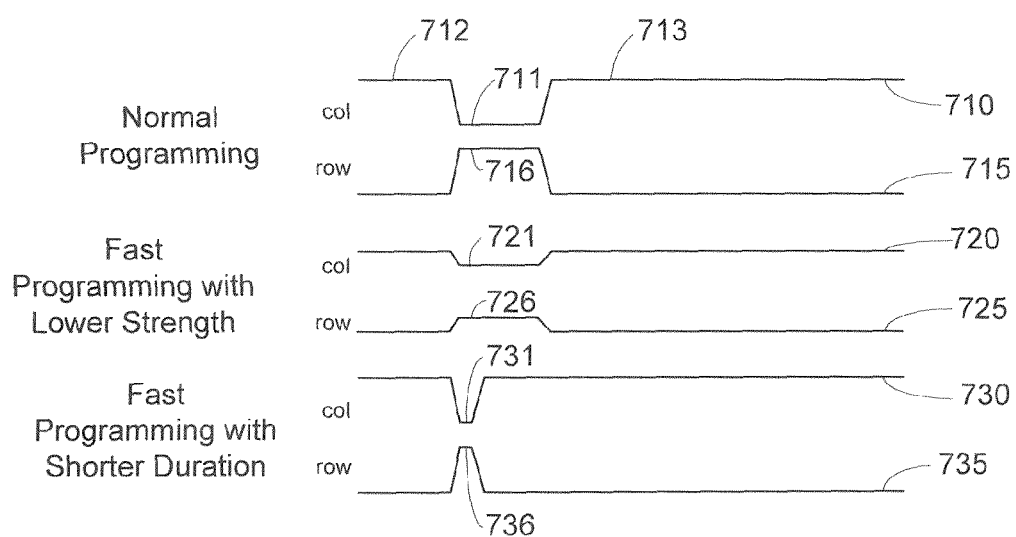
FIG. 7 is a graph of the programming signals for various modes of programming the programmable resistive switching network of FIG. 6.

FIG. 7 is a graph of the programming signals for various modes of programming the programmable resistive switching network of FIG. 6. In FIG. 7, signals 710 and 715 respectively represent examples of the column and row voltages/currents output by the column input driver and the row input driver, respectively, in normal mode programming. As noted above, in normal mode programming, the resistive element is programmed in a normal ON state. On the other hand, signals 720 and 725 respectively represent examples of the column and row voltages/currents output by the column input driver and the row input driver, respectively, in fast mode programming with lower strength. Finally, signals 730 and 735 respectively represent examples of the column and row voltages/currents output by the column input driver and the row input driver, respectively, in fast mode programming with shorter duration. As also noted above, in fast mode programming (with lower strength or with shorter duration or both), the resistive element is programmed in an intermediate ON state.

As can be seen in FIG. 6, outputs of the column input drivers and row input drivers are applied to the resistive elements. More specifically, they are applied to the programming terminals of the resistive elements. Accordingly, the signals shown in FIG. 7 represent the signals applied to the programming terminals of the resistive elements.

In one embodiment, during normal programming, the voltage applied across the resistive element is the voltage difference between signals 710 and 715, which is the normal programming voltage. Those skilled in the art would recognize that the voltage difference between signals 710 and 715 is non-zero only during the pulse portions of signals 710 and 715 (i.e., during pulse portions 711 and 716). During normal programming, this normal programming voltage is applied for the normal time period (i.e., during the duration of pulse portions 711 and 716). This allows the resistive element to be programmed at the normal ON state. In one embodiment, during fast programming with lower strength, the voltage applied across the resistive element is the voltage difference between signals 720 and 725, which is the intermediate programming voltage. Those skilled in the art would recognize that the voltage difference between signals 720 and 725 is non-zero only during the pulse portions of signals 720 and 725 (i.e., during pulse portions 721 and 726). During fast programming with lower strength, this intermediate programming voltage is applied for the normal time period (i.e., during the duration of pulse portions 721 and 726 which is equal to the duration of pulse portions 711 and 716). This allows the resistive element to be programmed at an intermediate ON state. Finally, in one embodiment, during fast programming with shorter duration, the voltage applied across the resistive element is the voltage difference between signals 730 and 735, which is the normal programming voltage. Those skilled in the art would recognize that the voltage difference between signals 730 and 735 is non-zero only during the pulse portions of signals 730 and 735 (i.e., during pulse portions 731 and 736). In one embodiment, the voltage difference between signals 730 and 735 is equal to the voltage difference between signals 710 and 715. During fast programming with shorter duration, this normal programming voltage is applied for the intermediate time period (i.e., during the duration of pulse portions 731 and 736). This also allows the resistive element to be programmed at an intermediate ON state.

In another embodiment, signals 710 and 715 represent the current applied to the resistive element during normal programming. Since the current entering one terminal of a two-terminal device is the negative of the current entering the other terminal of the two-terminal device, currents 710 and 715 have equal magnitude, but opposite signs. The current applied to the resistive element is the current represented by signals 710 and 715, which is the normal programming current. Those skilled in the art would recognize that the current represented by signals 710 and 715 is non-zero only during the pulse portions of signals 710 and 715 (i.e., during pulse portions 711 and 716). During normal programming, this normal programming current is applied for the normal time period (i.e., during the duration of pulse portions 711 and 716). This allows the resistive element to be programmed at the normal ON state. Also in another embodiment, signals 720 and 725 represent the current applied to the resistive element during fast programming with lower strength. Currents 720 and 725 have equal magnitude, but opposite signs. The current applied to the resistive element is the current represented by signals 720 and 725, which is the intermediate programming current. Those skilled in the art would recognize that the current represented by signals 720 and 725 is non-zero only during the pulse portions of signals 720 and 725 (i.e., during pulse portions 721 and 726). During fast programming with lower strength, this intermediate programming current is applied for the normal time period (i.e., during the duration of pulse portions 721 and 726, which is equal to the duration of pulse portions 711 and 716). This allows the resistive element to be programmed at an intermediate ON state. Finally, in another embodiment, signals 730 and 735 represent the current applied to the resistive element during fast programming with shorter duration. Currents 730 and 735 have equal magnitude, but opposite signs. The current applied to the resistive element is the current represented by signals 730 and 735, which is the normal programming current. Those skilled in the art would recognize that the current represented by signals 730 and 735 is non-zero only during the pulse portions of signals 730 and 735 (i.e., during pulse portions 731 and 736). In one embodiment, the magnitude of the current represented by signals 730 and 735 is equal to that of the current represented by signals 710 and 715. During fast programming with shorter duration, this normal programming current is applied for the intermediate time period (i.e., during the duration of pulse portions 731 and 736). This also allows the resistive element to be programmed at an intermediate ON state.

It is to be noted that the amplitudes of signals 710, 715, 720, 725, 730, and 735 are not necessarily the same when representing currents and voltages. As such, in some embodiments, the amplitudes of the corresponding current and voltage signals are different.

In one embodiment, resistive elements in programmable resistive switching network 600 are programmed one column at a time for testing the IC. In one such embodiment, resistive elements are programmed using fast programming with shorter duration. Accordingly, a signal is applied to the column driver of the column to be programmed such that it outputs a signal such as signal 730. The column drivers of the other columns receive signals such that they output a low binary value. Similarly, signals are provided to the row drivers such that each row driver whose corresponding resistive element is to be programmed in the intermediate ON state outputs a signal such as signal 735. Row drivers whose corresponding resistive elements are to be programmed in the OFF state are provided signals such that each of those row drivers outputs a low binary value.

In another embodiment, multiple columns of resistive elements in programmable resistive switching network 600 are programmed simultaneously for testing the IC. In one such embodiment, resistive elements are programmed using fast programming with lower strength. Accordingly, a signal is applied to the column drivers of the columns to be programmed such that they each output a signal such as signal 720. The column drivers of the other columns receive signals such that they output a low binary value. Similarly, signals are provided to the row drivers such that each row driver whose corresponding resistive element is to be programmed in the intermediate ON state outputs a signal such as signal 725. Row drivers whose corresponding resistive elements are to be programmed in the OFF state are provided signals such that each of those row drivers outputs a low binary value. In one specific embodiment, resistive elements in 100 columns are programmed simultaneously.

In such an embodiment, the time for programming each column in the programmable resistive switching network may remain the same. However, since a lower programming voltage/current is applied to each column, multiple columns may be programmed simultaneously without dissipating excessive power in the IC device. Programming multiple columns simultaneously, without violating the thermal limits of the IC device, allows for reducing the total time to program all the columns in the programmable resistive switching network. Those skilled in the art would recognize that programming multiple columns simultaneously involves including additional programming circuits to manage the greater complexity involved in the simultaneous programming.

In yet another embodiment, it is also possible to combine the fast programming with shorter duration and fast programming with lower strength. In other words, in such an embodiment there would be fast programming that involves both shorter duration (for the programming time period used for each column) and lower strength (for the programming voltage/current applied).

It is to be noted that in both FIGS. 5 and 7, the signals are not drawn to scale. This is the case for both the amplitude and the duration of the signals. Instead, the signals in each figure are intended to show relative magnitude or duration of the various signals in that figure without being to scale as to the degree of difference in magnitude or duration. It is to be noted that duration of the signals in FIGS. 5 and 7 refers to the duration during the pulse portion of the signal, rather than the entire period of the signal. For example, the duration of signal 510 in FIG. 5 refers to the duration of the pulse portion 511 of signal 510 and does not include the duration of the non-pulse portions 512 and 513 of signal 510. Similarly, for example, the duration of signal 710 in FIG. 7 refers to the duration of the pulse portion 711 of signal 710 and does not include the duration of the non-pulse portions 712 and 713 of signal 710.

It is also be noted that the ratio of normal programming voltages to intermediate programming voltages is not necessarily the same as the ratio of normal programming currents to intermediate programming currents. As such, in some embodiment, these ratios would be different. For example, these ratios are different in an embodiment where the resistive element has a non-linear current-voltage behavior.

FIG. 8 is a more detailed block diagram of one embodiment of a configuration controller in an IC of the present invention. Configuration controller 800 may also include an error detection function. As shown in FIG. 8, configuration controller 800 includes controller 810 and programming mode controller 820 coupled to controller 810. Controller 810 receives configuration data from configuration device 830 and provides address and control data back to configuration device 830. Controller 810 also sends configuration data to the address and data registers. More specifically, controller 810 sends column data to the address registers and row data to the data registers. Controller 810 also sends this data to programming mode controller 820. Programming mode controller 820 also receives programming mode signals. In one embodiment, the programming mode signals may be contained in the configuration data provided by configuration device 830. Using the programming mode signals and the configuration data, programming mode controller 820 generates programming control signals that it provides to the address registers and data registers. In some embodiments, programming mode controller 820 also provides programming control signals to row input drivers (such as those shown in FIG. 2). Also, in some embodiments, programming mode controller 820 also provides programming control signals to row input drivers (such as those shown in FIG. 6) and column input drivers (such as those shown in FIG. 6). In one embodiment, the programming mode signals specify the programming mode, e.g., normal, fast with lower strength, or fast with shorter duration. Also, in one embodiment, programming mode controller 820 is a state machine that uses the programming mode signals and the configuration data to generate the programming control signals.

Figure 9:
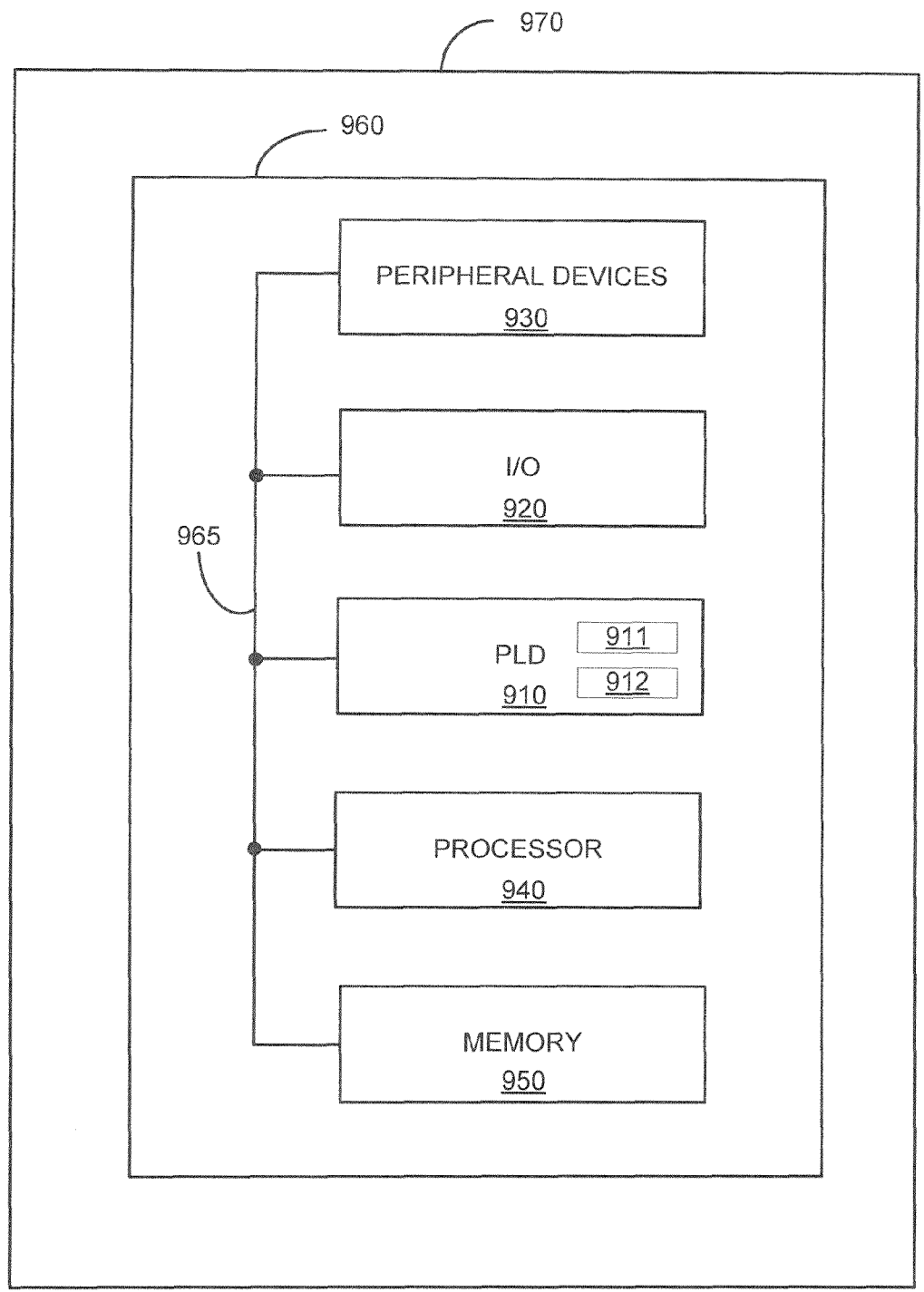
FIG. 9 illustrates an exemplary data processing system including an IC (e.g., a PLD) in accordance with embodiments of the present invention.

FIG. 9 illustrates an exemplary data processing system including an IC (e.g., a PLD) in accordance with embodiments of the present invention. FIG. 9 illustrates, by way of example, PLD 910 in data processing system 900. In one embodiment, PLD 910 may include a plurality of programmable resistive switching networks, but only one, programmable resistive switching network 911, is shown to avoid overcomplicating the drawing. Also, in one embodiment, PLD 910 may include a plurality of resistive memory circuits, but only one, resistive memory circuit 912, is shown to avoid overcomplicating the drawing. In one embodiment, programmable resistive switching network 911 and resistive memory circuit 912 are on the same die/chip as PLD 910.

Data processing system 900 may include one or more of the following components: processor 940, memory 950, input/output (I/O) circuitry 920, and peripheral devices 930. These components are coupled together by system bus 965 and are populated on circuit board 960 which is contained in end-user system 970. A data processing system such as system 900 may include a single end-user system such as end-user system 970 or may include a plurality of systems working together as a data processing system.

System 900 can be used in a wide variety of applications, such as computer networking, data networking, instrumentation, video processing, digital signal processing (DSP), or any other application where the advantage of using programmable or reprogrammable logic is desirable. PLD 910 can be used to perform a variety of different logic functions. For example, PLD 910 can be configured as a processor or controller that works in cooperation with processor 940 (or, in alternative embodiments, a PLD might itself act as the sole system processor). PLD 910 may also be used as an arbiter for arbitrating access to shared resources in system 900. In yet another example, PLD 910 can be configured as an interface between processor 940 and one of the other components in system 900. It should be noted that system 900 is only exemplary.

In one embodiment, system 900 is a digital system. As used herein a digital system is not intended to be limited to a purely digital system, but also encompasses hybrid systems that include both digital and analog subsystems.

Once an IC is programmed for testing, test data is applied to the IC and more specifically to the resistive elements in the IC. Thereafter, results of applying the test data to the IC are read back from the IC.

It is to be noted that, during testing, the programming time typically dominates over the actual test run time, since typically only a few clock cycles of testing are required. As a result, the test programming time typically constitutes a considerable percentage of the overall test time, which is the sum of the test programming time and actual test run time. Therefore, the benefits of faster programming outweigh any potential disadvantages in the possibly slower actual test time due to the higher ON state resistance of resistive elements programmed in the intermediate ON state instead of the normal ON state. Thus, for example, testing without use of embodiments of the present invention might have required 1s to program and 100 μs to actually run the test, while testing with use of embodiments of the present invention may require 10 ms to program and 10 ms (100 times 100 μs) to actually test, achieving a net reduction in the overall test time.

It is also to be noted that it may be desired to program some switches in the configurable logic at a low resistance state (i.e., the normal ON state) during testing instead of the intermediate ON state. For example, it may be desirable that switches routing the clock signals have a low resistance in order to ensure that the clock signals are transmitted with minimal skew. Thus, the clock switches may be programmed to a low resistance mode during test, or alternatively use conventional CRAM controlled pass transistors or other complementary metal-oxide semiconductor (CMOS) logic instead of resistive switches.

Additionally, an embodiment of the invention provides for RAM configured pass transistors in signal paths, or directly controlled signals to enable high speed testing. Aspects of this are already provided in contemporary FPGAs, such as the REGSCAN signal that is distributed globally in FPGAs available from Altera® Corporation of San Jose, Calif. to control the entire scan chain with minimal delay. Additional instances of this may be used to accelerate testing. For example, it may be advantageous to provide RAM control and conventional pass transistors for the clock multiplexing paths in an FPGA, or a dedicated clock path, so that the clock can operate at high speed, unencumbered by the high resistance switches.

Although the figures illustrating resistive elements, which may be programmed using embodiments of the methods of the present invention, show the resistive elements as having two terminals, these methods may also be used to program resistive elements having more than two terminals. Also, although the methods are described in the context of a resistive switching network, they also apply to memory cells and memory arrays including resistive elements.

As used herein, reference to exact numbers in the relative size of various parameters also encompasses approximation of those exact numbers. For example, a first parameter being 100 times greater than a second parameter also encompasses the first parameter being approximately 100 times greater than the second parameter.

While the present invention has been particularly described with respect to the illustrated embodiments, it will be appreciated that various alterations, modifications, and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements.

What is claimed is:

1. A method of testing an integrated circuit (IC), the method comprising:
    programming a resistive element in the IC at an intermediate ON state, wherein in addition to the intermediate ON state, the resistive element has another ON state, further wherein at the intermediate ON state, the resistive element has a resistance that is at least 10 times greater than a resistance of the resistive element at the another ON state; and
    applying test data to the resistive element,
    wherein the programming comprises programming an array of resistive elements that includes the resistive element, wherein the array of resistive elements includes N columns and M rows, wherein N and M are each integers greater than one, further wherein the programming includes programming resistive elements in one column of the plurality of columns,
    wherein the programming the resistive elements in the one column includes, for each resistive element in the one column to be programmed in the intermediate ON state, applying a normal voltage difference across programming terminals of the each resistive element for an intermediate time period, wherein the normal voltage difference is a voltage difference applied across programming terminals of the each resistive element for a normal time period to program the each resistive element in the another ON state, and further wherein the intermediate time period is shorter than the normal time period.

2. The method of claim 1 further comprising:
    reading from the IC results of the applying the test data to the resistive element.

3. The method of claim 1, wherein the resistive element is a switch in a programmable resistive switching network.

4. The method of claim 1, wherein the resistive element is in a memory cell.

5. A method of testing an integrated circuit (IC), the method comprising:
    programming a resistive element in the IC at an intermediate ON state, wherein in addition to the intermediate ON state, the resistive element has another ON state, further wherein at the intermediate ON state, the resistive element has a resistance that is at least 10 times greater than a resistance of the resistive element at the another ON state; and
    applying test data to the resistive element,
    wherein the programming comprises programming an array of resistive elements that includes the resistive element, wherein the array of resistive elements includes N columns and M rows, wherein N and M are each integers greater than one, further wherein the programming includes programming resistive elements in one column of the plurality of columns,
    wherein the programming the resistive elements in the one column includes, for each resistive element in the one column to be programmed in the intermediate ON state, applying a normal programming current to the each resistive element for an intermediate time period, wherein the normal programming current is a programming current applied to the each resistive element for a normal time period to program the each resistive element in the another ON state, and further wherein the intermediate time period is shorter than the normal time period.

6. A method of testing an integrated circuit (IC), the method comprising:

programming a resistive element in the IC at an intermediate ON state, wherein in addition to the intermediate ON state, the resistive element has another ON state, further wherein at the intermediate ON state, the resistive element has a resistance that is at least 10 times greater than a resistance of the resistive element at the another ON state; and applying test data to the resistive element, wherein the programming comprises programming an array of resistive elements that includes the resistive element, wherein the array of resistive elements includes N columns and M rows, wherein N and M are each integers greater than one, further wherein the programming includes simultaneously programming resistive elements in a plurality of columns of the N columns, further wherein the simultaneously programming the resistive elements in the plurality of columns includes, for each resistive element in the plurality of columns to be programmed in the intermediate ON state, applying an intermediate voltage difference across programming terminals of the each resistive element for a normal time period, wherein the intermediate voltage difference is smaller than a voltage difference applied across programming terminals of the each resistive element for the normal time period to program the each resistive element in the another ON state.

7. A method of testing an integrated circuit (IC), the method comprising:

programming a resistive element in the IC at an intermediate ON state, wherein in addition to the intermediate ON state, the resistive element has another ON state, further wherein at the intermediate ON state, the resistive element has a resistance that is at least 10 times greater than a resistance of the resistive element at the another ON state; and applying test data to the resistive element, wherein the programming comprises programming an array of resistive elements that includes the resistive element, wherein the array of resistive elements includes N columns and M rows, wherein N and M are each integers greater than one, further wherein the programming includes simultaneously programming resistive elements in a plurality of columns of the N columns, further wherein the simultaneously programming the resistive elements in the plurality of columns includes, for each resistive element in the plurality of columns to be programmed in the intermediate ON state, applying an intermediate programming current to the each resistive element for a normal time period, wherein the intermediate programming current is smaller than a programming current applied to the each resistive element for the normal time period to program the each resistive element in the another ON state.

8. A method of testing an integrated circuit (IC), the method comprising:

programming, at an intermediate ON state, a plurality of resistive elements in a column of an array of resistive elements in the IC, wherein the array includes N columns and M rows, wherein N and M are each integers greater than one, wherein in addition to the intermediate ON state, each resistive element of the plurality of resistive elements has another ON state, further wherein at the intermediate ON state, each resistive element of the plurality of resistive elements has a resistance that is at least 10 times greater than a resistance of the each resistive element at the another ON state;

applying test data to the array of resistive elements; and reading from the IC results of the applying the test data to the array of resistive elements, wherein, for each resistive element of the plurality of resistive elements, the programming includes, for each resistive element in the plurality of resistive elements, applying a normal voltage difference across programming terminals of the each resistive element for an intermediate time period, wherein the normal voltage difference is a voltage difference applied across programming terminals of the each resistive element for a normal time period to program the each resistive element in the another ON state, and further wherein the intermediate time period is shorter than the normal time period.

9. A method of testing an integrated circuit (IC), the method comprising:

programming, at an intermediate ON state, a plurality of resistive elements in a column of an array of resistive elements in the IC, wherein the array includes N columns and M rows, wherein N and M are each integers greater than one, wherein in addition to the intermediate ON state, each resistive element of the plurality of resistive elements has another ON state, further wherein at the intermediate ON state, each resistive element of the plurality of resistive elements has a resistance that is at least 10 times greater than a resistance of the each resistive element at the another ON state;

applying test data to the array of resistive elements; and reading from the IC results of the applying the test data to the array of resistive elements, wherein, for each resistive element of the plurality of resistive elements, the programming includes, for each resistive element in the plurality of resistive elements, applying a normal programming current to the each resistive element for an intermediate time period, wherein the normal programming current is a programming current applied to the each resistive element for a normal time period to program the each resistive element in the another ON state, and further wherein the intermediate time period is shorter than the normal time period.

10. An integrated circuit (IC) comprising:

a plurality of resistive elements; and a configuration controller coupled to the plurality of resistive elements, wherein the configuration controller includes a programming mode controller, wherein, during testing of the IC, the programming mode controller provides programming signals to program at least one resistive element of the plurality of resistive elements in an intermediate ON state, and, during normal usage of the IC, the programming mode controller provides programming signals to program the at least one resistive element in another ON state, further wherein, at the intermediate ON state, the at least one resistive element has a resistance that is at least 10 times greater than its resistance at the another ON state.

11. The IC of claim 10 further comprising:

an array of resistive elements including the plurality of resistive elements, wherein the array of resistive elements includes N columns and M rows, wherein N and M are each integers greater than one;

address registers coupled to the array of resistive elements; and data registers coupled to the array of resistive elements.

12. The IC of claim 11, wherein the configuration controller further comprises a controller coupled to the programming mode controller, wherein the controller receives configuration data, sends column data to the address registers, and sends row data to the data registers.

13. The IC of claim 11, wherein the array of resistive elements comprises a programmable resistive switching network.

14. The IC of claim 10, wherein, during testing of the IC, the programming signals result in applying a normal voltage difference across programming terminals of the at least one resistive element for an intermediate time period, wherein the normal voltage difference is a voltage difference applied across programming terminals of the at least one resistive element for a normal time period to program the at least one resistive element in the another ON state, and further wherein the intermediate time period is shorter than the normal time period.

15. The IC of claim 10, wherein, during testing of the IC, the programming signals result in applying a normal programming current to the at least one resistive element for an intermediate time period, wherein the normal programming current is a programming current applied to the at least one resistive element for a normal time period to program the at least one resistive element in the another ON state, and further wherein the intermediate time period is shorter than the normal time period.

16. The IC of claim 10, wherein, during testing of the IC, the programming signals result in applying an intermediate voltage difference across programming terminals of the at least one resistive element for a normal time period, wherein the intermediate voltage difference is smaller than a voltage difference applied across programming terminals of the at least one resistive element for the normal time period to program the at least one resistive element in the another ON state.

17. The IC of claim 10, wherein, during testing of the IC, the programming signals result in applying an intermediate programming current to the at least one resistive element for a normal time period, wherein the intermediate programming current is smaller than a programming current applied to the at least one resistive element for the normal time period to program the at least one resistive element in the another ON state.

18. The IC of claim 10, wherein the IC is a programmable logic device.

19. A digital system comprising the IC of claim 10.

* * * * *